(12) United States Patent
Moriyama et al.

(10) Patent No.: US 6,685,524 B2
(45) Date of Patent: Feb. 3, 2004

(54) PROCESS FOR PRODUCING ELECTROLUMINESCENT DEVICE WITH LIQUID CRYSTAL LAYER (75) Inventors: Takashi Moriyama, Kanagawa-ken (JP); Shinjiro Okada, Kanagawa-ken (JP); Akira Tsuboyama, Kanagawa-ken (JP); Takao Takiguchi, Tokyo (JP); Seishi Miura, Kanagawa-ken (JP); Jun Kamatani, Kanagawa-ken (JP); Manabu Furugori, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 295 days.

(21) Appl. No.: 09/924,517

(22) Filed: Aug. 9, 2001

(65) Prior Publication Data

US 2002/0070662 A1 Jun. 13, 2002

(30) Foreign Application Priority Data

| Aug. 11, 2000 | (JP) | 2000-243588 |
| Jun. 15, 2001 | (JP) | 2001-181061 |
| Aug. 6, 2001 | (JP) | 2001-237456 |

(51) Int. Cl.$^7$ ............................................. H05B 33/10
(52) U.S. Cl. ........................................ 445/24; 349/189
(58) Field of Search ............................ 445/24; 349/189, 349/190, 191, 188

(56) References Cited

U.S. PATENT DOCUMENTS

| 5,232,802 | A | * | 8/1993 | Rule et al. ............... 430/58.15 |
| 5,477,356 | A | * | 12/1995 | Kobayashi et al. ............ 349/84 |
| 5,683,833 | A | * | 11/1997 | Haussling et al. ........... 429/306 |
| 5,766,510 | A | * | 6/1998 | Hanna et al. ............ 252/299.62 |
| 5,821,003 | A | * | 10/1998 | Uemura et al. .............. 428/690 |
| 5,874,804 | A | * | 2/1999 | Rogers ........................ 313/512 |
| 5,942,066 | A | * | 8/1999 | Sunaga et al. ............... 156/102 |
| 5,965,907 | A | * | 10/1999 | Huang et al. .................. 257/89 |
| 6,218,061 | B1 | * | 4/2001 | Hanna et al. ............. 430/58.05 |
| 6,229,265 | B1 | * | 5/2001 | Schroeder-Perry et al. ............... 315/169.3 |
| 6,429,585 | B1 | * | 8/2002 | Kitazume et al. ........... 313/505 |
| 6,433,355 | B1 | * | 8/2002 | Riess et al. .................... 257/40 |
| 6,552,356 | B2 | * | 4/2003 | Imai ........................... 250/580 |

* cited by examiner

*Primary Examiner*—Kenneth J. Ramsey
(74) *Attorney, Agent, or Firm*—Fitzpatrick, Cella, Harper & Scinto (57) ABSTRACT

An organic electroluminescence device is constituted by a pair of substrates each provided with an electrode, and an organic luminescence layer of an organic luminescence material and a liquid crystal layer of a liquid crystal material, respectively disposed between the substrates. The liquid crystal material has an isotropic phase transition temperature lower than a glass transition temperature of the organic luminescence material. The liquid crystal layer has been formed by disposing the liquid crystal material on the organic luminescence layer in an isotropic phase state at a temperature lower than the glass transition temperature of the organic luminescence material and cooling the liquid crystal material to a temperature lower than the isotropic phase transition temperature.

4 Claims, 2 Drawing Sheets

PROCESS FOR PRODUCING ELECTROLUMINESCENT DEVICE WITH LIQUID CRYSTAL LAYER

FIELD OF THE INVENTION AND RELATED ART

The present invention relates to an organic electroluminescence device used as a light-emitting device for flat panel displays, projection displays, printers, etc., and a process for producing the organic electroluminescence device.

In flat panel display, a liquid crystal device has been widely used. Particularly, a so-called active matrix-type liquid crystal device (e.g., TFT (thin film transistor)-type liquid crystal device) wherein each pixel is provided with a switching or active element such as TFT has been used predominantly in the field of flat panel display.

In such an active matrix-type liquid crystal device, however, a nematic liquid crystal is generally used as a liquid crystal material and is accompanied with a longer response time (slower response speed) to an applied electric field, e.g., on the order of several ten milliseconds, thus being unsuitable for high-speed image display such as motion picture display. Further, the liquid crystal device is accompanied with a large dependence of viewing angle since a birefringence state of liquid crystal changes depending on a viewing direction.

In order to solve the above-mentioned problems, self-emission type devices for the flat panel display, such as a plasma emission device, a field emission device, and an electroluminescence device (hereinafter, referred to as "EL device") have attracted notice in recent years.

Of these self-emission type devices, the EL device is classified into an organic EL device and an inorganic EL device.

The inorganic EL device comprises a thin film EL device using an inorganic semiconductor (e.g., ZnS) driven by AC voltage application. The inorganic EL device is excellent in gradational characteristic and luminance but is accompanied with a problem such that the device is required to employ an AC drive voltage of the order of several hundred volts.

On the other hand, with respect to the organic EL device, T. W. Tang et al. have substituted in 1987 that it is possible to realize a high-luminance luminescence with low power consumption by utilizing a lamination structure comprising a film of fluorescent metal chelate complex and a film of diamine-based molecules.

Figure 1:
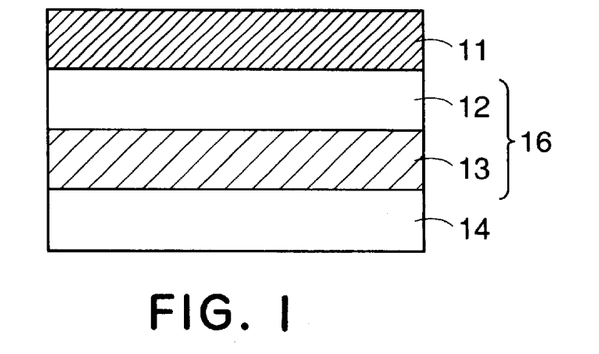
FIGS. 1 and 2 are respectively a schematic sectional view of an ordinary organic electroluminescence device.

The organic EL device is a self-emission device of carrier injection-type wherein electrons and holes are re-combined in a luminescence layer to cause luminescence (emission of light), as shown in FIG. 1.

FIG. 1 is a schematic sectional view of an embodiment of an ordinary organic EL device. Referring to FIG. 1, the organic EL device comprises a cathode 11, an anode 14, and an organic (compound) layer 16, including a luminescence layer 12 and a hole transport layer 13, disposed between the cathode 11 and the anode 14.

The organic EL device shown in FIG. 1 includes the organic layer 16 between the cathode 11 comprising a metal electrode and the anode 14 comprising a transparent electrode for emitting light therefrom. The respective layers (luminescence layer 12 and hole transport layer 13) constituting the organic layer 16 may generally have a thickness of the order of several hundred Å. Examples of a material for the metal electrode (cathode) 11 may generally include those having smaller work functions, such as aluminum, aluminum-lithium alloy and magnesium-silver alloy. Further, as a material for the transparent electrode (anode) 14, it is possible to use an electroconductive material having a lager work function, such as ITO (indium tin oxide).

Figure 2:
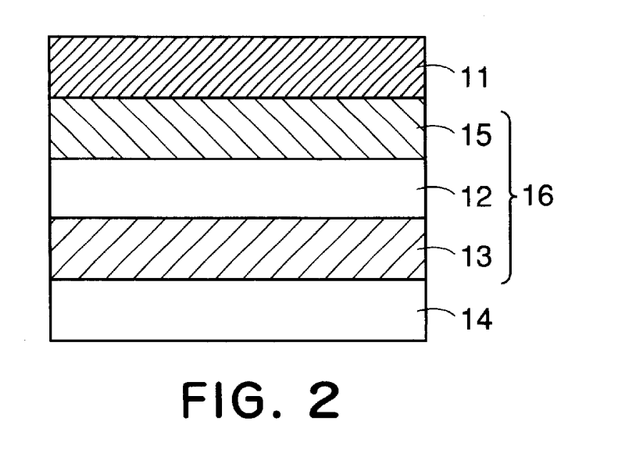

The organic layer 16 disposed between the cathode 11 and the anode 14 may have a three-layer structure including an electron transport layer 15, a luminescence layer 12 and a hole transport layer 13 as shown in FIG. 2, in addition to the lamination structure shown in FIG. 1.

The hole transport layer 13 has a function of efficiently injecting holes from the anode 14 to the luminescence layer 12. The electron transport layer 15 has a function of efficiently injecting electrons from the cathode 11 to the luminescence layer 12. Further, the hole transport layer 13 and the electron transport layer 15 also have functions of confining electrons and holes in the luminescence layer 12, respectively (i.e., carrier blocking functions), thus enhancing a luminescence efficiency.

With respect to carrier transport layers such as the hole transport layer 13 and the electron transport layer 15, it is important to improve charge (carrier) transport performances particularly a carrier mobility.

Generally, organic compounds in amorphous state have a carrier mobility of the order of $10^{-5}$ $cm^2$/V.sec, thus resulting in an insufficient (carrier) transport performance. Accordingly, if the carrier can be increased, it becomes possible to inject a larger amount of carriers into the luminescence layer, thus enhancing a resultant luminescence efficiency. At the same time, if a higher mobility can be achieved, it is possible to make a generally thin carrier transport layer (several hundred Å) thicker (about 1 $\mu$m), thus resulting in not only prevention of an occurrence of short circuit but also improvement in productivity.

For this reason, materials (compounds) for the carrier transport layers have been extensively developed in order to accomplish a high-efficiency organic electroluminescence device.

In such circumstances, some proposals have been made for achieving a higher (carrier) mobility by imparting a mesomorphism to an organic compound constituting a carrier transport layer (film). Generally, an organic layer (film) used in the organic EL device is in an amorphous state, thus having no regularity in molecular alignment (orientation). On the other hand, with respect to a liquid crystalline organic compound (or mesomorphic organic compound) exhibiting a certain order or regularity in molecular alignment or orientation, higher mobility materials have been found. Specifically, Haarer et al having confirmed that long-chain triphenylene compounds being a typical discotic liquid crystal exhibited a higher hole mobility of $10^{-1}$ $cm^2$/V.sec (Nature (1994), Vol. 371, pp. 141-). Haarer et al have also reported that a larger hole mobility was given by a higher degree of order in molecular alignment as a result of study on a relationship between a degree of order in molecular alignment and a hole mobility with respect to a series of triphenylene-based discotic liquid crystals in (discotic) columnar phase (Nature (1996), Vol. 8, pp. 815-). Further, Hanna et al have reported that a rod-shaped liquid crystal having a phenylnaphthalene skeleton exhibited a mobility of $10^{-2}$ $cm^2$/V.sec in its smectic E phase and that the liquid crystal had a high-speed bipolar carrier conductivity as to electrons and holes (Appl. Phys. Lett. (1998), Vol. 73, [25], pp. 3733-).

As described above, there is a possibility that molecular alignment advantageous to carrier transport is controlled by a spontaneous alignment (orientation) of a liquid crystalline organic compound, thus leading to a possibility that an excellent carrier transport material is realized.

Further, it has been found by our research group that it was possible to remarkably improve not only a carrier transport performance but also a carrier injection performance from an electrode based on a spontaneous alignment characteristic of a liquid crystalline organic compound as a result of study on the liquid crystalline carrier transport material (U.S. patent application Ser. No. 09/656,942, filed Sep. 7, 2000, corr. to Japanese Laid-Open Patent Application (JP-A) No. 2001-167888 and European Patent Application (EP-A) No. 1083613A2). Accordingly, it is possible to improve performances of organic EL device by using the liquid crystalline carrier transport layer as a carrier injection layer in combination with appropriate transport layer and luminescence layer.

The liquid crystalline organic compound also has an advantage in production process for an organic EL device. Generally, when an organic film is formed, vacuum vapor deposition is used for a low-molecular weight material, and spin coating is used for a polymeric material.

In the case where a thicker film (on the order of 1 $\mu$m) of a low molecular weight liquid crystalline organic compound is formed between a pair of electrodes, it is possible to employ a process wherein the liquid crystalline organic compound is heated to isotropic phase temperature to increase its flowability and then is injected into a gap between the electrodes in isotropic phase state by utilizing the capillary action, or a bonding process wherein the liquid crystalline organic compound placed in its isotropic phase is disposed on one of a pair of substrates and the resultant substrate is applied to the other substrate to complete bonding of the substrates.

Figure 3:
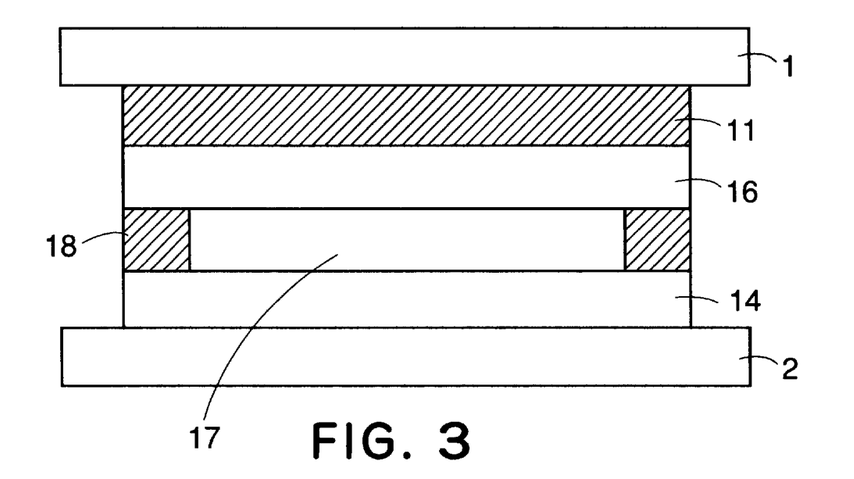
FIG. 3 is a schematic sectional view of an embodiment of the organic electroluminescence device according to the present invention.

The thus prepared organic EL device may generally have a structure shown in FIG. 3.

Referring to FIG. 3, the EL device may include a pair of substrates 1 and 2, a cathode 11, an anode 14, an organic (compound) layer 16 (capable of having the structures shown in FIGS. 1 and 2), a liquid crystalline organic layer 17, and a spacer 18. On the substrate 1, the cathode 11 and the organic layer 16 (including the luminescence layer 12) are successively formed. The substrate 1 is disposed opposite to the other substrate 2 having thereon the anode 14 to leave a gap therebetween with the spacer 18. Into the gap, a liquid crystalline organic compound heated into its isotropic phase is injected, followed by cooling the form the liquid crystalline organic layer 17.

The thus prepared organic EL device allows self-emission of primary colors of red (R), green (G) and blue (B) by appropriately selecting materials constituting the luminescence layer. As a result, it becomes possible to provide a full-color panel with excellent performances, such as high-speed responsiveness and wider viewing angle compared with the above-mentioned liquid crystal device. In order to realize a full-color display with sufficiently practical performances, it is necessary to provide an organic EL device excellent in luminance, chromaticity and luminescence efficiency for respective luminescence elements of R, G and B.

Generally, in the case where each of respective luminescence layers of R, G and B is formed only of a single material, it is difficult to sufficiently satisfy luminance, chromaticity, luminescence efficiency, etc. In order to obviate the difficulty, a colorant-doped type organic EL device including respective layers each comprising a host material doped with a fluorescent organic compound (fluorescent colorant) as a luminescent center is utilized.

In such a colorant-doped type organic EL device, a material constituting the hole transport layer 13, the electron transport layer 15 or the luminescence layer 12 is used as a host material and the resultant layer is doped with a very small amount of a fluorescent colorant, thus causing luminescence of the color of fluorescent colorant to emit light of the color therefrom. As a result, it is possible to utilize a colorant having a high fluorescence yield, thus improving a resultant luminescence efficiency and allowing a more latitude in selection of respective luminescence colors.

When the organic EL device is used as a display panel, the device is required to be driven at a current and voltage as low as possible in view of the life thereof and a constraint on withstand voltages of drivers. In the circumstances, a driving method using switching (active) elements has been assumed to be suitable for the organic EL device (U.S. Pat. No. 5,786,796 corr. to JP-A 8-241057; 10 the Fine Process Technology for Flat-Panel Display Conference Proceeding E2).

In the case where a low-molecular weight type EL device using switching (active) elements each as means for supplying an electric field between a pair of electrodes is prepared, a transparent electrode requiring a high-temperature process is first formed on a substrate provided with a plurality of switching elements in view of heat resistance and thereon, necessary organic compound layers are successively formed by vapor deposition, followed by vacuum vapor deposition of, e.g., aluminum having a mall work function for forming a metal electrode to prepare an organic electroluminescence device. As a result, emitted light is generally observed from the transparent electrode side (i.e., the side of the substrate provided with switching elements).

Such an organic EL device is also expected to be applied to a device using a transparent plastic substrate and is promising device for paper display (CEATEC Japan 2000 Pioneer).

As described above, the liquid crystalline organic compound has excellent performances in terms of carrier transfer, thus being promising as a material for a carrier transport layer of an organic EL device.

Further, as described above, the liquid crystalline organic compound can be readily formed in a thicker layer according to the above-mentioned injection process utilizing the isotropic liquid state thereof exhibiting a flowability or the bonding process.

However, when the organic EL device is prepared by forming a carrier transport layer of an liquid crystalline organic compound in the above-described manner, a luminescence layer of the EL device is deteriorated to lower a luminescence or emission luminance in some cases.

Further, when the organic EL device including switching elements is prepared, light is emitted from the side of a substrate provided with the switching elements as described above. As a result, the presence of switching elements and wiring lines therefor leads to a lower opening rate (ratio) of pixels.

On the other hand, organic EL devices including a substrate provided with switching elements and a counter substrate and emitting light from the counter substrate side have been proposed in JP-A 11-3048 and JP-A 2001-35663. In these devices, however, there is still room for improvement in positional accuracy or stability when a substrate having thereon an EL element electrode and the counter substrate having thereon the switching element electrode are applied to each other so as to arrange pixels in prescribed position.

Incidentally, Tokuhisa et al have reported that polarizing luminescence is effected by an organic EL device wherein liquid crystalline organic layer as a luminescence layer is formed by injecting a liquid crystal compound into a gap between a hole transport layer and an electron transport layer (Applied Physics Letters, Vol. 72, pp. 2639-(1988)).

On the other hand, in the present invention, a liquid crystalline organic layer is utilized as a carrier injection (and/or transport) layer for injecting (and/or transporting) carriers into a luminescence layer.

SUMMARY OF THE INVENTION

A principal object of the present invention is to provide an organic electroluminescence device having solved the above-mentioned problems and a process or producing the organic electroluminescence device.

A specific object of the present invention is to provide an organic electroluminescence device capable of suppressing a deterioration of a luminescence layer by using a liquid crystalline organic compound which exhibits a high mobility and is readily formed in a thickness layer.

Another object of the present invention is to provide an organic electroluminescence device capable of improving a pixel opening rate by forming a lamination structure of a transparent electrode to be formed at high temperature and an organic (compound) layer having a poor heat resistance in a particular manner.

A further object of the present invention is to provide an organic electroluminescence device of the type wherein an organic EL layer and a liquid crystal layer are formed between opposite electrodes formed on a pair of substrates including one provided with switching elements so as to allow light emission (luminescence) from the side of the substrate free from the switching elements.

A still further object of the present invention is to provide a process for producing the above-mentioned organic electroluminescence device.

According to the present invention, there is provided an organic electroluminescence device, comprising: a pair of substrates each provided with an electrode, and an organic luminescence layer of an organic luminescence material and a liquid crystal layer of a liquid crystal material, respectively disposed between the substrates; wherein the liquid crystal material has an isotropic phase transition temperature lower than a glass transition temperature of the organic luminescence material, and the liquid crystal layer has been formed by disposing the liquid crystal material on the organic luminescence layer in an isotropic phase state at a temperature lower than the glass transition temperature of the organic luminescence material and cooling the liquid crystal material to a temperature lower than the isotropic phase transition temperature.

According to the present invention, there is also provided a process for producing an organic electroluminescence device of the type comprising: a pair of substrates including a first substrate provided with a first electrode and a second substrate provided with a second electrode, and an organic luminescence layer and a liquid crystal layer, respectively disposed between the substrates the process comprising the steps of:

forming an organic luminescence layer of an organic luminescence material on a first electrode on the first substrate, disposing a liquid crystal material on the organic luminescence layer in an isotropic phase state at a temperature lower than a glass transition temperature of the organic luminescence material, and cooling the liquid crystal material to a temperature lower than the isotropic phase transition temperature thereof to form a liquid crystal layer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

The organic electroluminescence device according to the present invention basically has a structure shown in FIG. 3.

Referring to FIG. 3, an organic EL device includes a pair of substrates 1 and 2, a cathode 11 disposed on the substrate 1, an anode 14 disposed on the substrate 2, an organic (compound) layer 16 including at least a luminescence layer and disposed on the cathode 11, at least one liquid crystalline organic layer 17 disposed between the organic layer 16 and the anode 14 with a spacer 18.

One of the substrates 1 and 2 may be provided with a matrix of switching or active elements, such as TFTs (herein, referred to as "active matrix substrate or TFT substrate").

In the present invention, at least one of the substrates 1 and 2 may comprise plastics.

The liquid crystalline organic layer comprises a liquid crystalline organic compound assuming a liquid crystal phase, such as a discotic phase or a smectic phase.

As a result of our study on the above-mentioned deterioration phenomenon of luminescence layer of the conventional organic EL device, it has been clarified that a luminescence of emitted light was lowered when an organic layer (16 shown in FIG. 3) including a luminescence layer is heated together with a liquid crystalline organic layer (17 shown in FIG. 3) to a temperature exceeding a glass transition temperature (point) of a material for the luminescence layer in a step of injecting a liquid crystalline organic compound into a gap between a pair of substrates in its isotropic phase or a step of heating a device structure for bonding the pair of substrates to each other after a liquid crystalline organic compound is disposed on one of the substrate. This may be attributable to crystallization of the material for the luminescence layer caused by placing the luminescence layer in a state that the heating temperature exceeds the glass transition temperature of the luminescence layer material. The term "glass transition temperature (point)" is frequently used in he field of organic EL technology and is also used for low-molecular weight materials. Further, the (organic) material used for the organic layer is generally used in an amorphous state (which is a thermodynamically nonequilibrium state or a metastable state). The amorphous state may be observed for a crystalline material when it is formed in a layer by vapor deposition. When such an amorphous state-material is crystallized, the crystallized portion can be observed as dark spots where a luminescence efficiency is lowered.

In the present invention, the luminescence layer material and the liquid crystalline organic compound are selected so that an isotropic phase transition temperature (Tiso) of the liquid crystalline organic compound is lowered than a glass transition temperature (Tg) of the luminescence layer material (Tiso<Tg), thus preventing the deterioration of the luminescence layer in an injection step or re-alignment (re-orientation) step of the liquid crystalline organic compound.

The materials for the luminescence layer and the liquid crystalline organic layer used in the present invention are not particularly limited so long as the above temperature relationship (Tiso<Tg) is satisfied.

In a specific preferred embodiment, as the luminescence layer material, an aluminum quinolinol complex (a representative example of which is Alq3 (tris(8-quinolinolato) aluminum) having a structure shown below) is used. Alq3 has a glass transition temperature (Tg) of 175° C. as measured by a DSC (differential scanning calorimeter or calorimetry).

(Alq3)

The organic electroluminescence device shown in FIG. 3 of the present invention may further include a hole transport layer (not shown) and an electron transport layer (not shown) in the organic layer 16 or on the cathode 11 or the anode 14, or between the liquid crystalline organic layer 17 and the organic layer 16 or the anode 14.

Examples of a material for the hole transfer layer may include:

α-NPD (bis[N-1-(naphthyl)-N-phenyl]benzidine:

1-TANTA: 4,4',4"-tris(1-naphthylphenylamino)-triphenylamine,
2-TANTA: 4,4'-4"-tris(2-naphthylphenylamino)-triphenylamine, TCTA: 4,4',4"-tris(N-carbazoyl)triphenylamine,
p-DPA-TDAB: 1,3,5-tris[N-(4-diphenylaminophenyl)-phenylamino]benzene,
TDAB: 1,3,5-tris(diphenylamino)benzene,
TDTA: 4,4',4"-tris(diphenylamino)triphenylamine,
TDAPB: 1,3,5-tris[(diphenylamino)phenyl]benzene.

Further, examples of a material for the electron transfer layer may include: BeBq (bis(benzoquinolinolato) beryllium), DTVBi (4,4'-bis(2,2-di-p-tolylvinyl)biphenyl), Eu(DBM)3(Phen) (tris(1,3-diphenyl-1,3-propanediono) monophenan-throline)Eu(III)).

The liquid crystalline organic compound used in the present invention may preferably comprise those assuming a discotic phase or a smectic phase.

For example, when the above-mentioned Alq3 is formed in a luminescence layer, the following liquid crystalline organic compounds (LC-1 to LC-3) having structures and phase transition temperatures are measured by using the DSC.

(LC-1) R: —OC$_6$H$_{13}$
Phase transition temperature (°C.)

Cry. $\xrightarrow{68.4}$ D$_{hd}$ $\xrightarrow{98.9}$ Iso.

(LC-2) R: —SC$_6$H$_{13}$
Phase transition temperature (°C.)

D$_{ho}$ $\xrightarrow{75.1}$ D$_{hd}$ $\xrightarrow{93.6}$ Iso.

Cry.: crystal phase
D$_{hd}$: discotic hexagonal disordered phase
D$_{ho}$: discotic hexagonal ordered phase
Iso: isotropic phase (LC-3)

Phase transition temperature (° C.)

Cry. $\xrightarrow{81.6}$ SmX $\xrightarrow{128.7}$ N $\xrightarrow{131.7}$ Iso.

SmX: un-identified smectic phase
N: nematic phase

In the present invention, other constituting members of the organic EL device, such as the cathode (metal electrode), the anode (transparent electrode), and optional carrier transport layer(s) formed of a non-liquid crystalline organic compound may be those used in the conventional organic EL devices if the relationship: Tiso<Tg is fulfilled.

The liquid crystalline organic layer used in the present invention may be used as the hole transport layer or the electron transport layer, depending on its carrier transport performance.

The organic EL device of the present invention is prepared without adversely affecting the luminescence layer through a process wherein a liquid crystalline organic compound is formed in a layer between electrodes (cathode and anode) provided with prescribed organic layer(s) in an injection step of injecting the liquid crystalline organic compound at its isotropic phase transition temperature (Tiso) lower than a glass transition temperature (Tg) of a luminescence layer material or in a bonding step of bonding a pair of substrates (provided with prescribed organic layer (s) and the liquid crystalline organic layer) to each other.

In the organic EL device shown in FIG. 3 according to the present invention, at least one of the substrates 1 and 2 is required to be a transparent substrate, such a glass substrate, so as to allow light emission from the transparent substrate side.

Further, the liquid crystalline organic layer may appropriately be controlled to have a uniform and desired thickness by disposing a spacer between the pair of substrates, as ordinarily used in a liquid crystal display device.

In the case where the organic EL device of the present invention is used a display panel (device), a matrix of switching elements (e.g., TFTs) may effectively used in order to allow a lower voltage drive leading to the longer life of the display panel or higher-luminance display.

As described above, the conventional organic EL device using the switching elements is accompanied with a lowering in pixel opening rate due to the presence of the switching elements on the transparent electrode side (anode side) since the EL device is prepared by successively forming the anode, organic (EL) layer(s), and the cathode in this order on a substrate (active matrix substrate) having thereon the switching elements.

In the present invention, a substrate provided with a transparent electrode (anode) is prepared separately from the active matrix substrate provided with a metal electrode (cathode). On either one of these substrates, an organic (EL) layer including a luminescence layer is formed and, between the substrates, a liquid crystalline organic layer is formed in the above-mentioned injection or bonding step. As a result, emitted light is observed from the side of transparent electrode free from the switching elements, thus obviating the lowering in pixel opening rate.

In the step of forming the liquid crystalline organic layer, the resultant liquid crystalline organic layer, the resultant liquid crystalline organic layer is formed in thicker layer (e.g., of the order of 1 μm) but sufficiently functions as a carrier transport (and/or injection) layer since the liquid crystalline organic layer has a higher mobility. Further, the step of forming the liquid crystalline organic layer used in the present invention facilitates the production process of the organic EL device compared with those produced by using (vacuum) vapor deposition.

Figure 4:
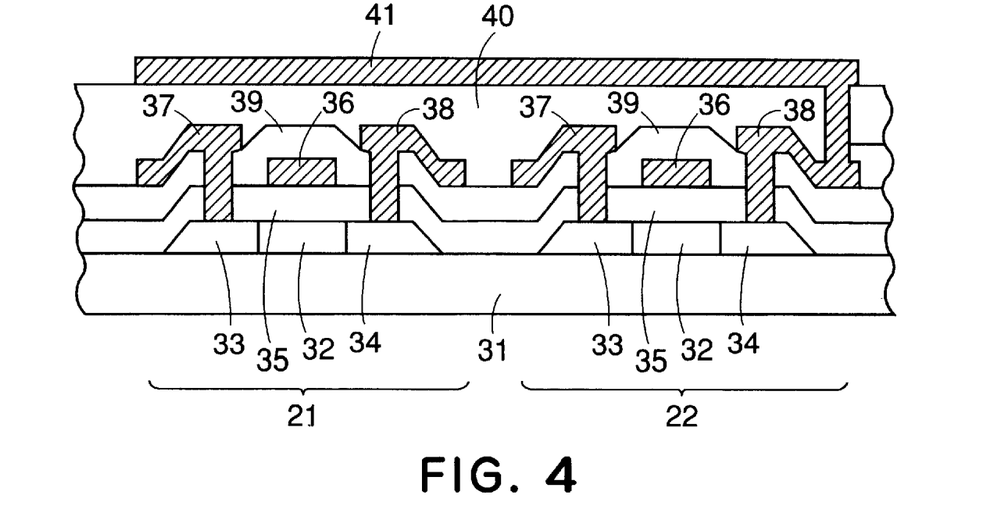
FIG. 4 is a schematic sectional view of an embodiment of an active matrix substrate for the organic electroluminescence device of the present invention.

FIG. 4 shows an embodiment of the organic EL device provided with a pixel electrode and two switching elements (two TFTs) in this embodiment for each (one) pixel on the side of an active matrix substrate, according to the present invention.

Referring to FIG. 4, the active matrix (TFT) substrate includes a TFT 21 for pixel selection, a TFT 22 for current control, a glass substrate 31, semiconductor layers 32 of p-Si (polycrystalline silicon), a-Si (amorphous silicon), etc., sources 33 and drawings 34 each formed by doping of an appropriate impurity in the semiconductor layers 32, gate insulating films 35 of SiO, SiNx, etc., gate electrodes 36, e.g., aluminum, source electrodes 37, drain electrodes 38, insulating layers 39, a passivation film 40, and a pixel electrode 41.

Figure 5:
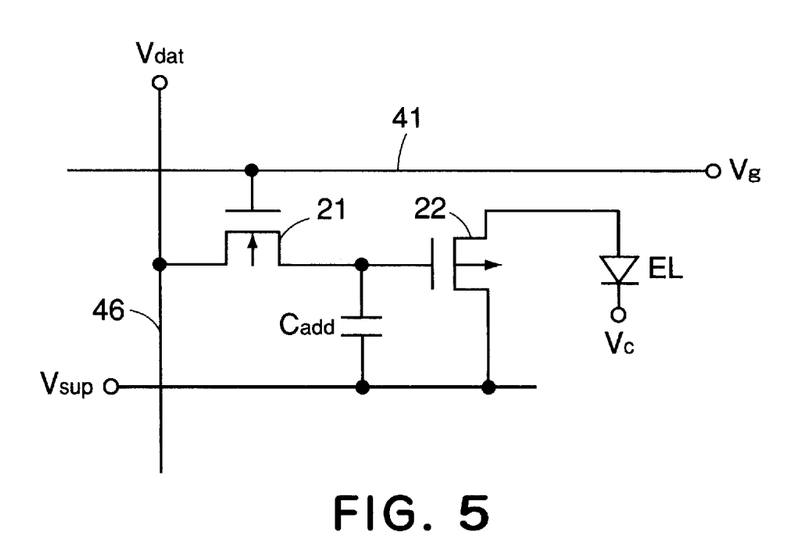
FIG. 5 is an equivalent circuit of one pixel portion of the organic electroluminescence device shown in FIG. 4.

FIG. 5 is an equivalent circuit of one pixel portion of the organic EL device shown in FIG. 4.

Referring to FIG. 5, each pixel is formed at each of intersections of a plurality of scanning lines 45 and a plurality of data signal lines 46 intersecting the scanning signal lines 45.

The organic EL device has a matrix of pixels two-dimensionally arranged in a plurality of rows and a plurality of columns. The gate electrodes 36 (FIG. 4) along each row of pixels are commonly connected to one scanning signal line 45 (FIG. 5), and the source electrodes 37 (FIG. 4) along each column of pixels are commonly connected to one data signal line 46 (FIG. 5), thus forming a matrix of electrodes (wiring lines).

When the organic EL device is driven in a line sequential manner, a gate signal line Vg is selected to turn on the TFT 21 (for pixel selection), whereby charges are supplied from the source 33 of the TFT 21 to a capacitor Cadd. The supplied charges change a potential of the gate electrode 36 of the TFT 22 (for current control) and a current amplified depending on the capacitance of Cadd flows in the organic layer at a pixel concerned until a subsequent scanning operation is performed. As a result, a light emission (luminescence) state is continued through one frame period.

More specifically, the organic EL device is of a current drive-type, thus requiring a circuit supplying a certain current in each selection period. A pixel along the TFT 21 is selected by applying signal voltages to a gate signal line Vg and a data signal line Vdat, whereby carriers (charged) depending on the signal voltages are stored in an additive capacitor Cadd. The carriers at that time are supplied from a source line Vsup. The resultant current depending on a potential generated in Cadd is carried from the TFT 22 to the EL device to cause luminescence. A reference numeral Vc represents a common line.

In the present invention, the switching elements used for the organic EL device may be MIM (metal-insulator-metal) elements, and the substrate 31 may be a monocrystalline Si substrate.

Hereinbelow, the present invention will be described more specifically based on Examples.

EXAMPLE 1

An organic electroluminescence device driven in an active matrix driving scheme was prepared by using a TFT substrate and a counter substrate in the following manner.

(Preparation of TFT substrate)

On a 1.1 mm-thick glass substrate (surface unevenness or roughness=±2 nm) provided with a plurality of TFTs and wiring lines for driving the TFTs in an active matrix during scheme, a metal electrode (cathode) of Al in a thickness of 100 nm was formed as a pixel electrode for each pixel (one pixel area=0.25 mm$^2$) by vacuum vapor deposition (background pressure of $2.7 \times 10^{-3}$ Pa).

On the metal electrode, a 40 nm-thick luminescence layer of Alq3 (Tg=175° C.) was formed by vacuum vapor deposition (2.7×10⁻³ Pa).

Then, on the luminescence layer, a 60 nm-thick hole transport layer of αNPD (available from Dojin Kagaku K. K.) was formed by vacuum vapor deposition (2.7×10⁻³ Pa), thus preparing a TFT substrate.

(Preparation of counter substrate)

On a 1.1 mm-thick glass substrate, a ca. 70 nm-thick transparent electrode (anode) of ITO (indium tin oxide) was formed by sputtering.

On the surface of the transparent electrode (ITO film), a 0.01 wt. %-liquid of silica beads (average particle size=1.3 μm) in IPA (isopropyl alcohol) was coated by spin coating at 1500 rpm for 10 sec. so as to provide a dispersion density of 100 (particles)/mm². On the thus-treated substrate, a UV (ultraviolet)-curable liquid adhesive was coated by printing process at a periphery of the substrate (a region other than a display region), thus preparing a counter substrate.

The above-prepared TFT substrate and the counter substrate were applied to each other so that the αNPD (hole transport) layer and the ITO film faced each other with a gap therebetween, followed by curing of the adhesive by UV light irradiation with a low-pressure mercury lamp to prepare a blank cell having a cell gap (a spacing to be filled with a liquid crystalline organic compound) of 1.1 μm.

Into the gap (between the luminescence layer and the ITO film), a liquid crystalline organic compound (LC-1 (Tiso= 98.9° C.) described above) heated to 100° C. was injected in its isotropic phase state.

After the injection, the resultant cell was gradually cooled from the isotropic phase state to 70° C. (where the LC-1 assumed Dhd (discotic hexagonal disordered phase)) on a hot stage ("FP82", mfd. by Mettler Co.) provided with a temperature controller ("FP80HT", mfd. by Mettler Co.), thus preparing an organic EL device.

At 70° C., the organic EL device was connected to a drive circuit and driven at a DC drive voltage (a DC voltage applied between the cathode and the anode) of 8 volts, whereby a uniform luminescence (light emission) of green was confirmed at a current density of 5 mA/mm².

EXAMPLE 2

An organic EL device was prepared and driven in the same manner as in Example 1 except that a liquid crystalline organic compound (LC-2) was injected into the black cell at 95° C. and the drive voltage (8 volts) was changed to 10 volts.

As a result, a uniform luminescence of green was confirmed.

EXAMPLE 3

An organic EL device was prepared and driven in the same manner as in Example 1 except that a mixture of a liquid crystalline organic compound (LC-4) having a formula shown below with a 1 wt. %-TCNQ having a formula shown below was injected into the black cell at 80° C. and the EL device was driven at 60° C. where the mixture assumed a discotic columnar phase.

(LC-4)

R: —OC₅H₁₁
(TCNQ)

Phase transition temperature (°C.) of Mixture of LC-4 and TCNQ

D: discotic columnar phase

As a result, a uniform luminescence of green was confirmed.

EXAMPLE 4

An organic electroluminescence device driven in an active matrix driving scheme was prepared by using a TFT substrate and a counter substrate in the following manner.

(Preparation of TFT substrate)

On a 1.1 mm-thick glass substrate (surface unevenness= ±2 nm) provided with a plurality of TFTs and wiring lines for driving the TFTs in an active matrix during scheme, a metal electrode (cathode) of Al in a thickness of 100 nm was formed as a pixel electrode for each pixel (one pixel area= 0.25 mm²) by vacuum vapor deposition (background pressure of 2.7×10⁻³ Pa).

(Preparation of counter substrate)

On a 1.1 mm-thick glass substrate, a ca. 70 nm-thick transparent electrode (anode) of ITO (indium tin oxide) was formed by sputtering.

Then, on the ITO film, a 60 nm-thick hole transport layer of αNPD (available from Dojin Kagaku K. K.) was formed by vacuum vapor deposition (2.7×10⁻³ Pa).

On the hole transport layer, a 40 nm-thick luminescence layer of Alq3 (Tg=175° C.) was formed by vacuum vapor deposition (2.7×10⁻³ Pa), thus preparing a counter substrate.

On the surface of the TFT substrate (Al layer), a 0.01 wt. %-liquid of silica beads (average particle size=1.3 μm) in IPA was coated by spin coating at 1500 rpm for 10 sec. so as to provide a dispersion density of 100 (particles)/mm². On the thus-treated substrate, a UV-curable liquid adhesive was coated by printing process at a periphery of the substrate (a region other than a display region).

The above treated TFT substrate and the counter substrate were applied to each other so that the Al layer and the luminescence layer faced each other with a gap therebetween, followed by curing of the adhesive by irradiation of UV light with a low-pressure mercury lamp to prepare a blank cell having a cell gap (a spacing to be filled with a liquid crystalline organic compound) of 1.1 μm.

Into the gap (between the Al layer and the luminescence layer), a liquid crystalline organic compound (LC-3 (Tiso= 131.7° C.) described above) heated to 135° C. was injected in its isotropic phase state.

After the injection, the resultant cell was gradually cooled from the isotropic phase state to 100° C. (where the LC-3 assumed smectic phase on a hot stage ("FP82", mfd. by Mettler Co.) provided with a temperature controller ("FP80HT", mfd. by Mettler Co.), thus preparing an organic EL device.

At 100° C., the organic EL device was connected to a drive circuit and driven at a DC drive voltage of 8 volts, whereby a uniform luminescence (light emission) of green was confirmed.

COMPARATIVE EXAMPLE 1

An organic EL device was prepared and driven in the same manner as in Example 1 except that a liquid crystalline organic compound (LC-5; Tiso=237° C. shown below was injected into the black cell at 245° C. and the EL device was driven at 130° C. where LC-5 assumed a discotic columnar phase.

(LC-5)

R: —OOC—CH$_2$OC$_5$H$_{11}$

Phase transition temperature (°C.)

Cry. $\xrightarrow{30.0}$ D $\xrightarrow{237.0}$ Iso.

As a result, no luminescence was confirmed. This may be attributable to the higher isotropic phase transition temperature (Tiso=237.0° C.) of LC-5 compared with the glass transition temperature (Tg=175° C.) of Alq3 (luminescence layer material). Specifically, when the liquid crystalline organic compound (LC-5) is injected into the blank cell in its isotropic phase (at 245° C.), Alq3 constituting the luminescence layer is crystallized under the temperature condition exceeding its glass transition temperature, thus causing a deactivation site observed as dark spots.

EXAMPLE 5

An organic electroluminescence device driven in an active matrix driving scheme was prepared by using a TFT substrate and a counter substrate in the following manner.

(Preparation of TFT substrate)

On a 1.1 mm-thick glass substrate (surface unevenness= ±2 nm) provided with a plurality of TFTs and wiring lines for driving the TFTs in an active matrix during scheme, a metal electrode (cathode) of Al in a thickness of 100 nm was formed as a pixel electrode for each pixel (one pixel area= 0.25 mm$^2$) by vacuum vapor deposition (background pressure of 2.7×10$^{-3}$ Pa).

On the metal electrode, a 40 nm-thick luminescence layer of Alq3 (Tg=175° C.) was formed by vacuum vapor deposition (2.7×10$^{-3}$ Pa).

Then, on the luminescence layer, a 60 nm-thick hole transport layer of αNPD (available from Dojin Kagaku K. K.) was formed by vacuum vapor deposition (2.7×10$^{-3}$ Pa), thus preparing a TFT substrate.

(Preparation of counter substrate)

On a 1.1 mm-thick glass substrate, a ca. 70 nm-thick transparent electrode (anode) of ITO (indium tin oxide) was formed by sputtering.

On the surface of the transparent electrode (ITO film), a solution of a liquid crystalline organic compound (LC-1) (Tiso=98.9° C.) in chloroform was applied by sin coating, followed by vaporization of the solvent on a hot plate at 100° C. to obtain a 500 nm-thick liquid crystalline organic layer.

On the thus-treated substrate, a UV-curable liquid adhesive was coated by printing process at a periphery of the substrate (a region other than a display region), thus preparing a counter substrate.

The thus-prepared counter substrate was heated up to 100° C. (where LC-1 assumed isotropic phase) and, under reduced pressure, was applied to the TFT substrate (not heated) so that the liquid crystalline organic layer (LC-1) and the hole transport layer (αNPD) closely contacted each other, followed by curing of the adhesive by irradiation of UV light with a low-pressure mercury lamp.

After the curing of the adhesive, the resultant cell was gradually cooled from the isotropic phase state to 70° C. (where the LC-1 assumed Dhd (discotic hexagonal disordered phase)) on a hot stage ("FP82", mfd. by Mettler Co.) provided with a temperature controller ("FP80HT", mfd. by Mettler Co.), thus preparing an organic EL device.

At 70° C., the organic EL device was connected to a drive circuit and driven at a DC drive voltage of 8 volts, whereby a uniform luminescence (light emission) of green was confirmed

COMPARATIVE EXAMPLE 2

An organic EL device was prepared and driven in the same manner as in Example 1 except that the liquid crystalline organic compound (LC-1) was formed in a 30 nm-thick liquid crystalline organic layer by vacuum vapor deposition (2.7×10$^{-3}$ Pa).

As a result, short-circuit was observed at many pixels (at a ratio of ca. 70% per the entire pixels) and a luminescence state was ununiform. This may be attributable to an insufficient thickness of the liquid crystalline organic layer.

As described hereinabove, according to the present invention, a liquid crystalline organic layer providing a high mobility is formed at a temperature lower than the glass transition temperature of luminescence layer material, thus effectively suppressing a deterioration of the luminescence layer. As a result, it becomes possible to provide a high-reliable organic electroluminescence device including a good carrier injection and/or transfer layer. Further, according to the present invention, the liquid crystalline organic layer is formed as a thicker layer, thus providing a resultant organic EL device with high reliability and good productivity free from an occurrence of short circuit.

In addition, in the present invention, the liquid crystalline organic layer is formed between a pair of substrates, so that it becomes possible to increase a pixel opening rate and luminance even in an organic EL device provided with a plurality of switching elements.

What is claimed is:

1. A process for producing an organic electroluminescence device of the type comprising: a pair of substrates including a first substrate provided with a first electrode and a second substrate provided with a second electrode, and an organic luminescence layer and a liquid crystal layer, respectively disposed between the substrates the process comprising the steps of:
   forming an organic luminescence layer of an organic luminescence material on a first electrode on the first substrate,
   disposing a liquid crystal material on the organic luminescence layer in an isotropic phase state at a temperature lower than a glass transition temperature of the organic luminescence material, and
   cooling the liquid crystal material to a temperature lower than the isotropic phase transition temperature thereof to form a liquid crystal layer.

2. A process according to claim 1, wherein in the step of disposing the liquid crystal material, the liquid crystal material is injected into a gap between the organic luminescence layer and a second electrode which is formed on the second substrate and spaced apart from the first electrode on the first substrate.

3. A process according to claim 1, wherein in the step of disposing the liquid crystal material, the liquid crystal material is applied onto the organic luminescence layer to form a liquid crystal layer, and after the step of cooling the liquid crystal material, a second electrode other than the first electrode is formed on the liquid crystal layer.

4. A process according to claim 1, wherein the liquid crystal layer has a thickness larger than that of the organic luminescence layer.

* * * * *

UNITED STATES PATENT AND TRADEMARK OFFICE
CERTIFICATE OF CORRECTION

PATENT NO. : 6,685,524 B2
DATED : February 3, 2004
INVENTOR(S) : Takashi Moriyama et al.

It is certified that error appears in the above-identified patent and that said Letters Patent is hereby corrected as shown below:

Title page,
Item [56], References Cited, U.S. PATENT DOCUMENTS,
after "5,766,510", please insert the following -- 5,786,796 7/28/98 Takayama et al.--; and after "5,965,907", please insert the following -- 6,175,345 B1 1/16/01 Kuribayashi et al. --.
please insert the following:
--FOREIGN PATENT DOCUMENTS,
1 083 613      3/14/01      Europe
8-241057       9/17/96      Japan
11-3048        1/6/99       Japan
2001-16788     1/19/01      Japan
2001-35663     2/9/01       Japan --.
please insert the following: --Other Documents C.W. Tang et al., "Organic electroluminescent diodes", Appl. Phys. Lett 51 (12), 21 September 1987, pp. 913-915.

D. Adam et al., "Fast photoconduction in the highly ordered columnar phase of a discotic liquid crystal", Nature, Vol. 371, 8 September 1994, pp. 141-143.

M. Funahashi et al., "Anomalous high carrier mobility in smectic E phase of a 2-phenylnaphthalene derivative", 1998 American Institute of Physics, Applied Physics Letters, Volume 73, Number 25, 21 December 1998, pp. 3733-3735.

H. Tokuhisa et al., "Polarized electroluminescence from smectic mesophase", 1998 American Instititue of Physics, Applied Physics Letters, Volume 72, Number 21, 25 May 1998, pp. 2639-2641.

J. Simmnerer et al., "Transient Photoconductivity in a Discotic Hexagonal Plastic Crystal, Advanced Materials," 1996, 8, No. 10, pp. 815-819. --.

Column 4,
Line 19, "10the" should read -- 10th --.

Column 6,
Line 65, "he" should read -- the --.

Column 9,
Line 23, "such" should read -- such as --.

UNITED STATES PATENT AND TRADEMARK OFFICE
CERTIFICATE OF CORRECTION

PATENT NO. : 6,685,524 B2
DATED : February 3, 2004
INVENTOR(S) : Takashi Moriyama et al.

It is certified that error appears in the above-identified patent and that said Letters Patent is hereby corrected as shown below:

Column 14,
Line 14, "sin coating." should read -- spin coating --.
Line 38, "firmed" should read -- firmed. --.

Signed and Sealed this

Twenty-eighth Day of June, 2005

JON W. DUDAS
*Director of the United States Patent and Trademark Office*